(12) United States Patent
Bruneel

(10) Patent No.: US 10,558,773 B2
(45) Date of Patent: Feb. 11, 2020

(54) TRANSIENT CACHING FOR MIXED-SIGNAL ELECTRONICS SIMULATION

(71) Applicant: Autodesk, Inc., San Rafael, CA (US)

(72) Inventor: Karel Bruneel, San Francisco, CA (US)

(73) Assignee: AUTODESK, INC., San Rafael, CA (US)

(*) Notice: Subject to any disclaimer, the term of this patent is extended or adjusted under 35 U.S.C. 154(b) by 858 days.

(21) Appl. No.: 15/087,674

(22) Filed: Mar. 31, 2016

(65) Prior Publication Data
US 2016/0292336 A1    Oct. 6, 2016

Related U.S. Application Data

(60) Provisional application No. 62/140,933, filed on Mar. 31, 2015.

(51) Int. Cl.
*G06F 17/50*    (2006.01)

(52) U.S. Cl.
CPC ............... *G06F 17/5036* (2013.01)

(58) Field of Classification Search
CPC ................................................ G06F 17/5036
USPC ............................................................ 703/14
See application file for complete search history.

(56) References Cited

U.S. PATENT DOCUMENTS

| | | | | |
|---|---|---|---|---|
| 6,530,065 B1* | 3/2003 | McDonald | .......... | G06F 17/5036 716/102 |
| 6,577,992 B1* | 6/2003 | Tcherniaev | ......... | G06F 17/5036 703/14 |
| 7,283,942 B1* | 10/2007 | Lewis | ................. | G06F 17/5036 703/14 |
| 7,693,700 B1* | 4/2010 | Vanderhoek | ........ | G06F 17/5031 703/14 |
| 8,886,508 B2* | 11/2014 | Gullapalli | ........... | G06F 17/5022 703/14 |
| 9,135,383 B2* | 9/2015 | Gullapalli | ........... | G06F 17/5036 |

(Continued)

OTHER PUBLICATIONS

Yeuzhou Zhang et. al., A Large-scale Online Search System of High-Dimensional Vectors Based on Key-Value Store, 2012 Eighth International Conference on Semantics, Knowledge and Grids, IEEE, pp. 233-236 (Year: 2012).*

(Continued)

*Primary Examiner* — Rehana Perveen
*Assistant Examiner* — Justin C Mikowski
(74) *Attorney, Agent, or Firm* — Gates & Cooper LLP

(57) ABSTRACT

A method, system, and computer program product provide the ability to simulate an electronic circuit. An analog model represents an analog circuit and is wrapped to serve as a module in an event based simulator. The module has a first start state and an input (controlled by the event based simulator). Upon a change in a value of the input, the analog model shows a transient behavior. The value of the input is changed to begin simulating the electronic circuit. In response to the changing of the value, if not already cached, the transient behavior is cached with a key consisting of a combination of the first start state and the value of the input. If already cached, the transient behavior is retrieved from the cache. The simulation of the circuit is output based on the cached transient behavior.

14 Claims, 6 Drawing Sheets

(56) References Cited

U.S. PATENT DOCUMENTS

2012/0143585 A1* 6/2012 Barsukov ............ G01R 31/362
                                                                703/18

OTHER PUBLICATIONS

"Transient Response of Resistor-Capacitor (RC) and Resistor-Inductor (RL) Circuits", Sep. 11, 2014 http://www.labsanywhere.net/circuit/lectures/lect7/lecture7.php.

* cited by examiner

TRANSIENT CACHING FOR MIXED-SIGNAL ELECTRONICS SIMULATION

CROSS-REFERENCE TO RELATED APPLICATIONS

This application claims the benefit under 35 U.S.C. Section 119(e) of the following co-pending and commonly-assigned U.S. provisional patent application(s), which is/are incorporated by reference herein:

Provisional Application Ser. No. 62/140,933, filed on Mar. 31, 2015, with inventor(s) Karel Bruneel, entitled "Transient Caching for Mixed-Signal Electronics Simulation".

BACKGROUND OF THE INVENTION

1. Field of the Invention

The present invention relates generally to electronic circuits, and in particular, to a method, apparatus, and article of manufacture for simulating electronic circuits and caching certain properties in such a simulation to improve the simulation speed.

2. Description of the Related Art

In the bigger picture of Maker/DIY (Do It Yourself) and the new manufacturing revolution and disruption that AUTODESK™ is driving with the SPARK™ application (an open platform for building better three-dimensional printing software, hardware, materials, and services), the integration of custom mechanical designs and custom PCB (printed circuit board) designs provides a whole next level of innovation for the industry beyond the current 3D printing efforts of SPARK™.

Predictions for the future may include users printing objects that require electronics integration. As many users will not have experience with such electronics components, there exists a need for simulation of electronics in objects as well as systems to automatically assist users in that integration.

Simulating electronics is very computationally expensive and therefore slow. Such problems may be particularly true in the case of transient analysis, where a system of non-linear differential equations needs to be solved. Interacting with real time simulated electronics is therefore impossible in almost all interesting cases.

For this reason there are not many interactive electronics simulators out there. Most of these simulators simply run the old fashioned simulation and slowdown the perceived time in order to be able to cope with the heavy simulation. The interactive simulation is therefore viewed in slow-motion.

Other techniques may include a system of non-linear differential equations that is piecewise linearized or where calculation of device equations is cached. These techniques only result in marginal speedups that are not enough to build a real-time interactive simulator.

Further, some prior art simulators simplify the electronic circuit by disregarding any transient behavior, resulting in relatively fast simulations. Transient behavior, as used herein, refers to the transient response (e.g., of resistor-capacitor [RC] and resistor-inductor [RL] circuits. The transient response (also known as the natural response) in an RC or RL circuit is the way the circuit responds to energies stored in storage elements, such as capacitors and inductors. If a capacitor has energy stored within it, then that energy can be dissipated/absorbed by a resistor. How that energy is dissipated is the Transient Response. However, in many cases, it is the transient behavior that is interesting, so circuits that disregard transient behavior cannot be simulated correctly.

In view of the above, what is needed is an interactive electronic circuit simulator that considers transient behaviors in real-time.

SUMMARY OF THE INVENTION

Embodiments of the invention solve the problem of the prior art by caching transient behavior. When a circuit is in a certain state and certain stimuli are applied to its inputs, the behavior (over time) will always be the same. This behavior is cached and reused when the same situation is encountered at some other point in time. This results in a huge speedup since the cache completely bypasses the solving of the system of non-linear differential equations.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Hardware Environment

Figure 1:
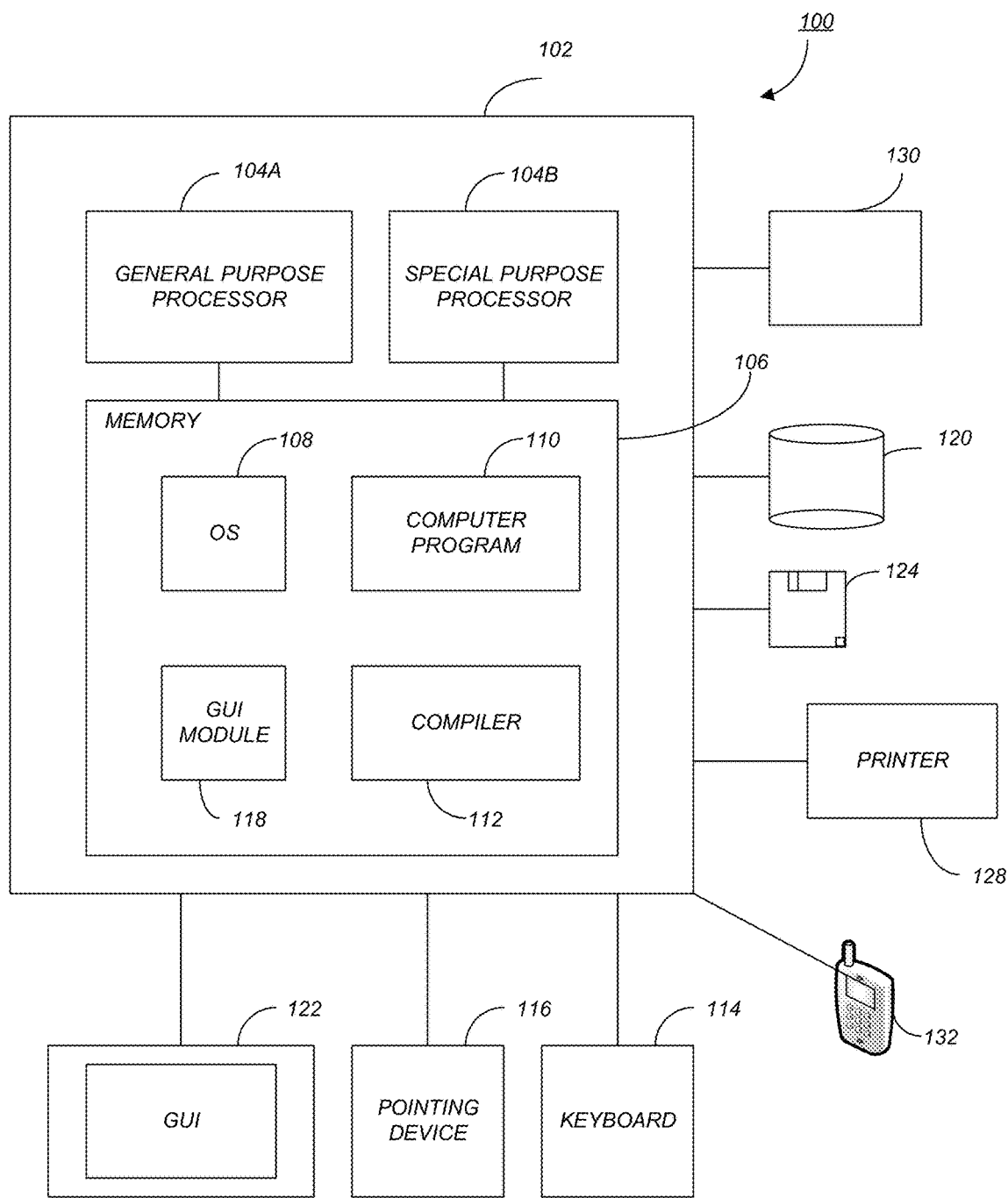
FIG. 1 is an exemplary hardware and software environment used to implement one or more embodiments of the invention.

FIG. 1 is an exemplary hardware and software environment 100 used to implement one or more embodiments of the invention. The hardware and software environment includes a computer 102 and may include peripherals. Computer 102 may be a user/client computer, server computer, or may be a database computer. The computer 102 comprises a general purpose hardware processor 104A and/or a special purpose hardware processor 104B (hereinafter alternatively collectively referred to as processor 104) and a memory 106, such as random access memory (RAM). The computer 102 may be coupled to, and/or integrated with, other devices, including input/output (I/O) devices such as a keyboard 114, a cursor control device 116 (e.g., a mouse, a pointing device, pen and tablet, touch screen, multi-touch device, etc.) and a printer 128. In one or more embodiments, computer 102 may be coupled to, or may comprise, a portable or media viewing/listening device 132 (e.g., an MP3 player, IPOD™, NOOK™, portable digital video player, cellular device, personal digital assistant, etc.). In yet another embodiment, the computer 102 may comprise a multi-touch device, mobile phone, gaming system, internet enabled television, television set top box, or other internet enabled device executing on various platforms and operating systems.

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108, to provide output and results.

Output/results may be presented on the display 122 or provided to another device for presentation or further processing or action. In one embodiment, the display 122 comprises a liquid crystal display (LCD) having a plurality of separately addressable liquid crystals. Alternatively, the display 122 may comprise a light emitting diode (LED) display having clusters of red, green and blue diodes driven together to form full-color pixels. Each liquid crystal or pixel of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface (GUI) module 118. Although the GUI module 118 is depicted as a separate module, the instructions performing the GUI functions can be resident or distributed in the operating system 108, the computer program 110, or implemented with special purpose memory and processors.

In one or more embodiments, the display 122 is integrated with/into the computer 102 and comprises a multi-touch device having a touch sensing surface (e.g., track pod or touch screen) with the ability to recognize the presence of two or more points of contact with the surface. Examples of multi-touch devices include mobile devices (e.g., IPHONE™, NEXUS S™, DROID™ devices, etc.), tablet computers (e.g., IPAD™, HP TOUCHPAD™), portable/handheld game/music/video player/console devices (e.g., IPOD TOUCH™, MP3 PLAYERS, NINTENDO 3DS™, PLAYSTATION PORTABLE™, etc.), touch tables, and walls (e.g., where an image is projected through acrylic and/or glass, and the image is then backlit with LEDs).

Some or all of the operations performed by the computer 102 according to the computer program 110 instructions may be implemented in a special purpose processor 104B. In this embodiment, the some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program 110 instructions. In one embodiment, the special purpose processor 104B is an application specific integrated circuit (ASIC).

The computer 102 may also implement a compiler 112 that allows an application or computer program 110 written in a programming language such as COBOL, PASCAL, C++, FORTRAN, or other language to be translated into processor 104 readable code. Alternatively, the compiler 112 may be an interpreter that executes instructions/source code directly, translates source code into an intermediate representation that is executed, or that executes stored precompiled code. Such source code may be written in a variety of programming languages such as JAVA™ PERL™, BASIC™, etc. After completion, the application or computer program 110 accesses and manipulates data accepted from I/O devices and stored in the memory 106 of the computer 102 using the relationships and logic that were generated using the compiler 112.

The computer 102 also optionally comprises an external communication device such as a modem, satellite link, Ethernet card, or other device for accepting input from, and providing output to, other computers 102.

In one embodiment, instructions implementing the operating system 108, the computer program 110, and the compiler 112 are tangibly embodied in a non-transitory computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of computer program 110 instructions which, when accessed, read and executed by the computer 102, cause the computer 102 to perform the steps necessary to implement and/or use the present invention or to load the program of instructions into a memory 106, thus creating a special purpose data structure causing the computer 102 to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 102.

Figure 2:
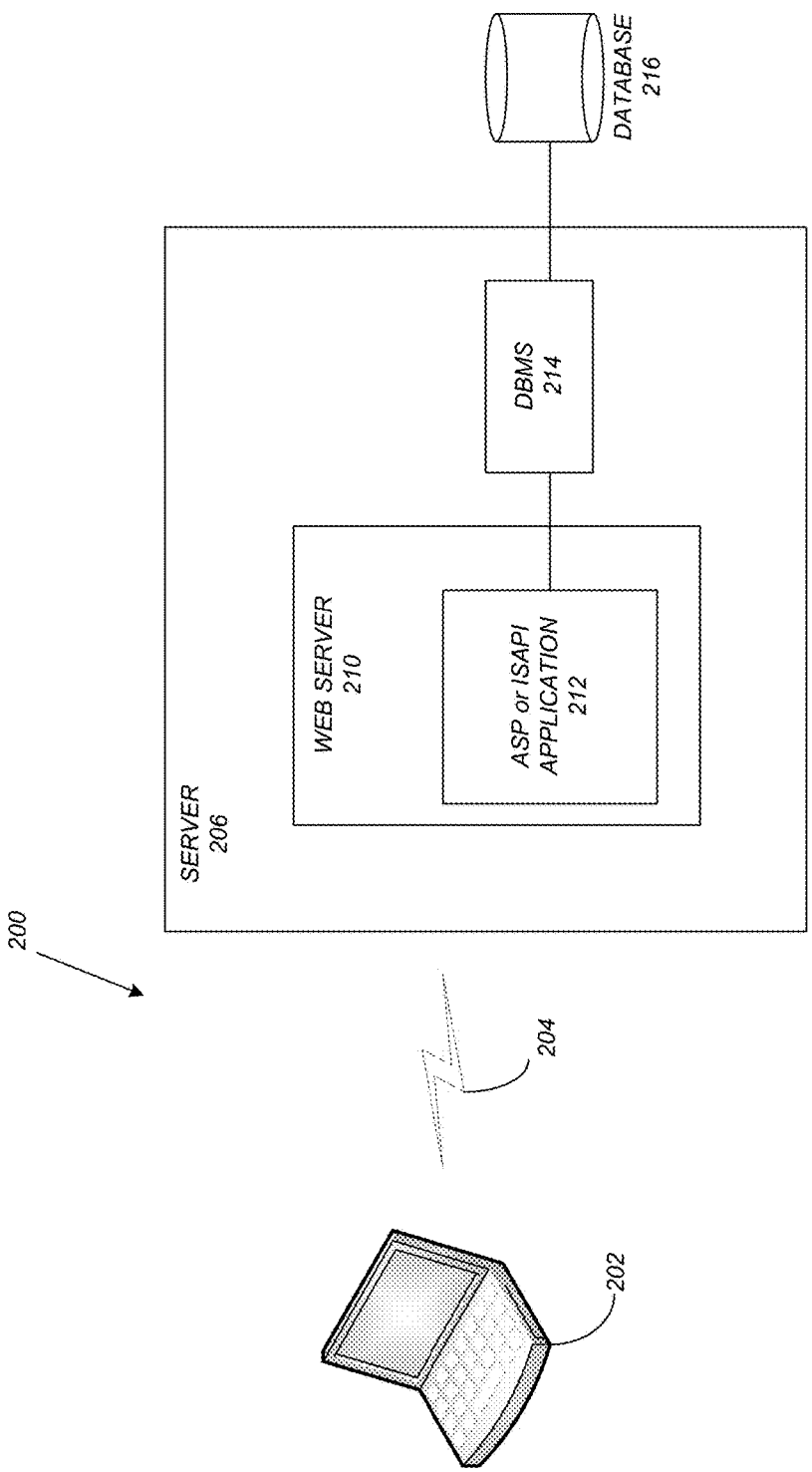
FIG. 2 schematically illustrates a typical distributed computer system using a network to connect client computers to server computers in accordance with one or more embodiments of the invention.

FIG. 2 schematically illustrates a typical distributed computer system 200 using a network 204 to connect client computers 202 to server computers 206. A typical combination of resources may include a network 204 comprising the Internet, LANs (local area networks), WANs (wide area networks), SNA (systems network architecture) networks, or the like, clients 202 that are personal computers or workstations (as set forth in FIG. 1), and servers 206 that are personal computers, workstations, minicomputers, or mainframes (as set forth in FIG. 1). However, it may be noted that different networks such as a cellular network (e.g., GSM [global system for mobile communications] or otherwise), a satellite based network, or any other type of network may be used to connect clients 202 and servers 206 in accordance with embodiments of the invention.

A network 204 such as the Internet connects clients 202 to server computers 206. Network 204 may utilize ethernet, coaxial cable, wireless communications, radio frequency (RF), etc. to connect and provide the communication between clients 202 and servers 206. Clients 202 may execute a client application or web browser and communicate with server computers 206 executing web servers 210. Such a web browser is typically a program such as MICROSOFT INTERNET EXPLORER™, MOZILLA FIREFOX™, OPERA™, APPLE SAFARI™, GOOGLE CHROME™, etc. Further, the software executing on clients 202 may be downloaded from server computer 206 to client computers 202 and installed as a plug-in or ACTIVEX™ control of a web browser. Accordingly, clients 202 may utilize ACTIVEX™ components/component object model (COM) or distributed COM (DCOM) components to provide a user interface on a display of client 202. The web server 210 is typically a program such as MICROSOFT'S Internet Information Server™.

Web server 210 may host an Active Server Page (ASP) or Internet Server Application Programming Interface (ISAPI) application 212, which may be executing scripts. The scripts invoke objects that execute business logic (referred to as business objects). The business objects then manipulate data in database 216 through a database management system (DBMS) 214. Alternatively, database 216 may be part of, or connected directly to, client 202 instead of communicating/obtaining the information from database 216 across network 204. When a developer encapsulates the business functionality into objects, the system may be referred to as a component object model (COM) system. Accordingly, the scripts executing on web server 210 (and/or application 212) invoke COM objects that implement the business logic. Further, server 206 may utilize MICROSOFT'S™ Transaction Server (MTS) to access required data stored in database 216 via an interface such as ADO (Active Data Objects), OLE DB (Object Linking and Embedding DataBase), or ODBC (Open DataBase Connectivity).

Generally, these components 200-216 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 202 and 206 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 202 and 206.

Software Embodiments

Embodiments of the invention are implemented as a software application on a client 202 or server computer 206. Further, as described above, the client 202 or server computer 206 may comprise a thin client device or a portable device that has a multi-touch-based display.

As described above, simulating electronics is very computationally expensive and therefor slow. Certainly in the case of transient analyses, where a system of non-linear differential equations needs to be solved. Interacting with real time simulated electronics is therefore impossible in almost all interesting cases.

Embodiments of the invention solve the problem of the prior art by caching transient behavior that is reused when the same situation (e.g., inputs and stimuli) is encountered. More specifically, if a circuit is in a certain state, and certain inputs (e.g., waves) are applied to the circuit, the state of the circuit will change in a particular way. This change in state may be cached and used if the same state and inputs are encountered again. To better understand such a solution various examples may be useful.

Figure 3:
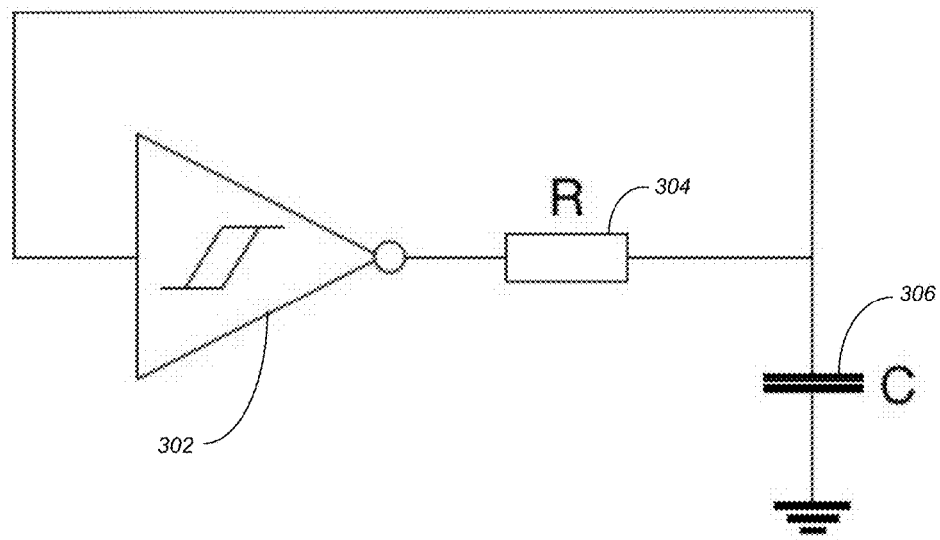
FIG. 3 illustrates a schematic of a ring oscillator in accordance with one or more embodiments of the invention.

Assume one desires to model the ring oscillator shown in FIG. 3. This simple circuit contains a smith-trigger NOT-gate 302, a resistor 304, and a capacitor 306. For smith-trigger gate 302, the input voltage is interpreted as a logic '1' when the voltage level rises above some threshold (e.g. 0.8V) and is seen as logic '0' when it drops below another voltage (e.g. 0.1V), so there is some hysteresis.

Figure 4:
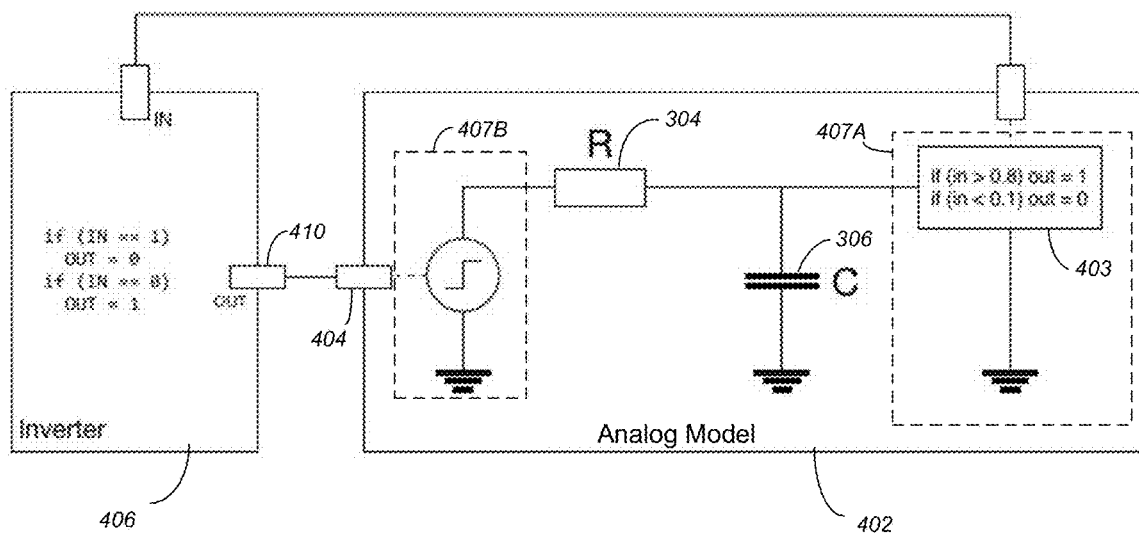
FIG. 4 illustrates a mixed-signal model simulated in accordance with one or more embodiments of the invention.

In a simulator of embodiments of the invention, this circuit is represented as a mixed-signal model as illustrated in FIG. 4. The resistor 304 and the capacitor 306 together with an input model 407A and output model 407B of the inverter are represented as an analog continuous-time model (analog model 402) and the logic function of the inverter is represented as an event-based model 406. In general, there could be multiple analog models 402 and multiple event-based models 406.

The top-level simulator is an event-based simulator that runs all of the event-based models 406. The analog models 402 are wrapped so they can serve as modules in the event based simulator. Conventionally, each time one of the inputs 404 of a wrapped analog model 402 is changed, this triggers the analog simulator. It is this number of simulations that are drastically reduced by using a cache.

Figure 5:
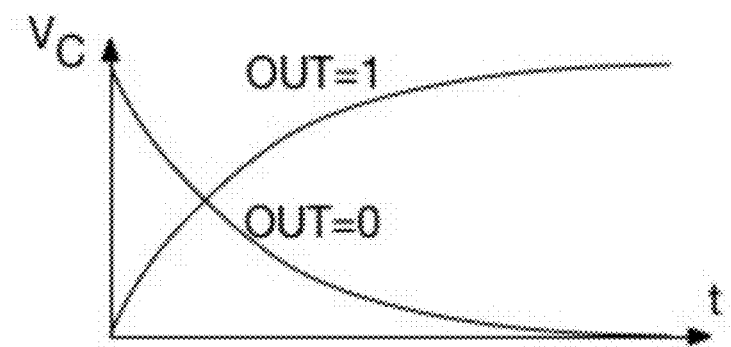
FIG. 5 illustrates transients of the analog model 402 of FIG. 4 in accordance with one or more embodiments of the invention.

Lets first focus on the analog models 402. An analog model 402 has state, which is represented by a state vector. Basically, this vector contains capacitor voltages and inductor currents. The models 402 are controlled from a number of discrete signals that originate from the event based simulator. In the example of FIG. 4, there is only one input 404 and that is the output signal 410 of the Inverter event-based model 406. Each time these input signals 404 change value, the circuit state will show some transient behavior in which the state of the model 402 moves away from the current state. The transients of the analog model 402 of the example are shown in FIG. 5. There is one transient waveform for when the output 410 of the inverter event-based model 406 is 1V and the capacitor 306 voltage starts at 0V; and one for when the output 410 of the inverter event-based model 406 is 0V and the capacitor voltage starts at 1V.

If the inputs 404 are kept constant long enough, the circuit will end up in a steady state. This steady state can be a constant value (this is the case in the example of FIG. 4) or an oscillation. The transient behavior towards this steady state only depends on:

the state on the moment the inputs 404 changed value (start state); and the new values of the input signals.

Figure 6:
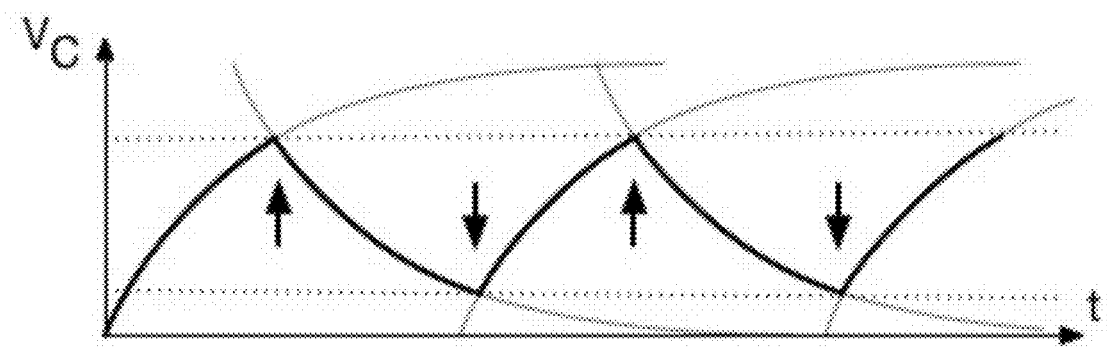
FIG. 6 illustrates the piecewise waveform of the oscillator of FIG. 3 in accordance with one or more embodiments of the invention.

When simulating a circuit, the same situation (circuit state and input values) may be encountered/arrived at several times. It will thus be beneficial to store the transient behavior in a cache with a key of the combination of the circuit state and the input values. This works as follows. If the inputs 404 of the analog model 402 change value, one first looks in the cache to see if this situation has been encountered before. If not, the waveform for the current state is simulated until a steady state is reached. The transient behavior is stored in the cache with the start situation as the key. After the waveform has been obtained, by simulation or straight from the cache, it is stitched to the already obtained waveform. In this way, a piecewise waveform is built that represents the signal values for the complete simulation run. The piecewise waveform of the oscillator of FIG. 3 is shown in FIG. 6.

Until now, the description has only examined the simulation of an analog circuit and how the waveform can be efficiently built for a simulation run. In one situation however, the analog circuit models are part of a higher-level event-based simulation model. The event-based simulation model controls the inputs to the analog models and in this way creates transients in the state of these models. Further, the analog model will create events that serve as input to the event based part of the overall model. These output events of an analog model are created by so called triggers. In the example of FIG. 4, there is one trigger represented by the rectangle 403 with the trigger condition. This trigger 403 models the input smith-trigger behavior of the NOT-gate. A trigger fires an event in the event based model when a certain condition of the state is met. In the oscillator example of FIG. 3, the input model of the smith-trigger inverter will generate a rising edge event when the input voltage rises above 0.8V and it will create a falling edge when the input voltage drops below 0.1. These events are represented by arrows in FIG. 6.

Since the value and the relative timing of these events only depend on the current waveform, the relative events (timing is relative to start of the waveform) can also be stored in the cache together with its associated waveform. When stitching the complete waveform, one simply needs to take these stored relative events from the cache, make them absolute by adding the start time of the waveform, and add them to the event queue. This results in even more performance improvement.

Actually storing the events would be enough to simulate the correct behavior on the event-based level, but since it is desirable for the waveforms to be observable by the user with for example the virtual oscilloscope, the waveforms still need to be stored and the stitching performed.

Figure 7:
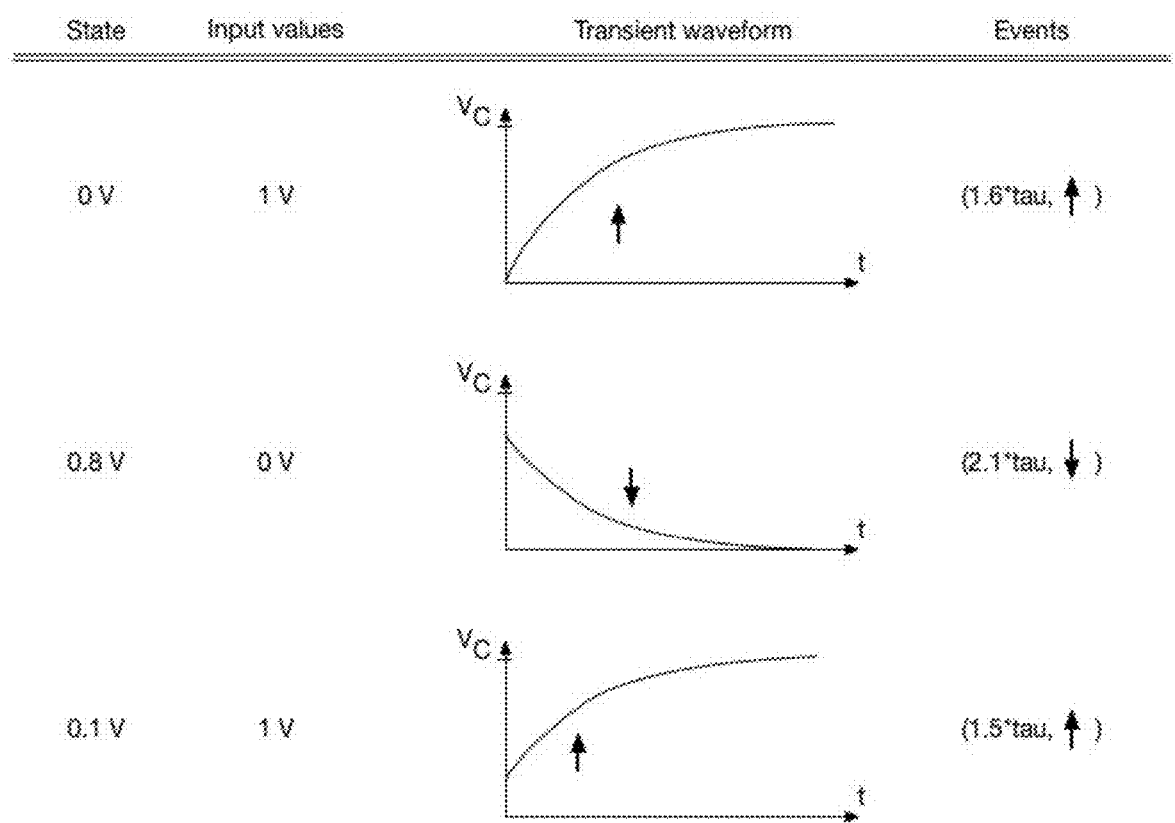
FIG. 7 illustrates three-simulations performed to warm up the cache in accordance with one or more embodiments of the invention.

FIG. 7 illustrates the content of the cache after it has warmed up. As illustrated, only three simulations are required to warm up the cache. The three simulations are represented by the three keys representing the start values (State,InputValues): (0V,1V); (0.8V,0V); and (0.1V,1V). The content stored in the cache is the transient waveform resulting after the steady state is reached. The cache further includes the stored relative events that are dependent on the associated waveform (e.g., the 1.6*tau and a rising edge, the 2.1*tau and the falling edge, and the 1.5*tau and a rising edge). After the cache is warm, future waveforms are simply generated by lookup and stitching. This is a huge speed improvement compared to repeating the simulations over and over.

So basically, embodiments of the invention are building an event based-model in the form of a lookup table. The lookup table has as its key, the state and the input values, and returns the relative events.

The creation of this event-based model is now done on the fly on the client side and is repeated for every simulation run. However, this could easily be improved by saving the cache between simulation runs. In addition, the cache could be saved on the server and the cache could also be warmed up on the server. This opens a path to doing all heavy computation on the server and still having a smooth interactive simulator on the client side. This could be ideal for mobile devices.

Event Based Simulation

The psuedo-code below shows the main loop of a basic event based simulator. While there are events in the event queue, the simulator picks the first event from the priority queue (ordered by time from low to high), executes the event, and repeats for all of the other events with the same time. Executing an event means that the signal (that the event is associated with) gets the end value of the events as its new value. Next, the set of all activated processes is found. This is the set of all processes that are sensitive to the events that have been executed in the previous step. In the third step these processes are executed. In this case, one may simply execute the process function.

```
Simulator.Simulator = function( ){
        self.queue = new
        Collections.Heap( );
};
Simulator.run = function( ){
        while (!self.queue.isEmpty( )) {
                self.time = self.queue.top( ).time;
                //Change the signal values
                var activatedSignals = new Collections.HashSet( );
                while (self.queue.top( ) &&
                self.time.equal(self.queue.top( ).time)) {
                        var event = self.queue.pop( );
                        if (!event.removed) {
                                event.execute( );
                                activatedSignals.add(event.signal);
                        }
                }
                //Execute active processes
                var activatedProcesses = new Collections.HashSet( );
                activatedSignals.forEach(function(signal){
                        activatedProcesses.addAll(signal.processes);
                });
                activatedProcesses.forEach(function(info){
                        var module   = info[0];
                        var func     = info[1];
                        var args     = info[2];
                        func.apply(module,args);
                });
        }
};
```

Dynamic Event-Based Model for Analog Circuitry

The analog model 402 representing the circuit example of FIG. 3 is implemented as a process in the event based simulator. The pseudo-code of this process is shown below. The code is annotated.

```
Simulator.AnalogModel.process = function( ) {
        // Get the current time
        var time = self.sim.time.time;
        // Get the current state (capacitor voltages, inductor currents, ...)
        var state = self.piecewise_waveform.state_vector(time);
```

```
// Get the voltage on all the nodes before applying new inputs
var voltage_before = self.piecewise_waveform.voltage_vector(time);
// Get the new inputs (source voltages, component parameters, ...)
var inputs = self.getInputs(time);
// Try to find the transient behaviour in the cache
var result = self.cache.get(state, inputs);
if (!result) {
    // If the transient behaviour is not in the cache.
    var result = { };
    // Run the analog simulator starting from current state and
    // using the current inputs. Results in a waveform for all
    // nodes in the circuit.
    // Voltage before is used as a first guess for the voltage at the nodes.
    result.waveform = self.analog_sim_until_steady_state(state, inputs, voltage_before);
    // Which triggers are fired in this segment of the waveform result.triggers_fired
    = self.trigger_events_waveform(result.waveform);
    // Store the segments in the cache with the state and the input as the key.
    self.cache.insert(state, inputs, result);
}
// What is the voltage directly after applying the new inputs
var voltage_after = result.waveform.getPoint(0).voltage;
var triggers_fired = new Collections.HashSet( );
triggers_fired.addAll(result.triggers_fired);
// Which triggers are fired due to the possible discontinuity at the start
// of the new transient segment.
triggers_fired.addAll(self.getFiredTrigger(voltage_before, voltage_after));
// Fire the triggers by injecting events in the event based simulator.
var trigger_events = [ ];
triggers_fired.forEach(function(trigger_fired){
    var trigger = trigger_fired.trigger;
    var event = trigger.fire(time + trigger_fired.time, trigger_fired.value);
    trigger_events.push(event);
});
// Keep track of the complete waveform by stitching the new segment.
self.piecewise_waveform.addSegment(time, result.waveform, trigger_events);
};
```

The cache may be implemented as a hashmap of KD-trees (k-dimensional tree). The hash map takes the input vector as its key and the KD-tree takes the state as its key. Such an implementation may be utilized when the inputs will only take a discrete number of values. While the state can slightly diverge because of numeric error.

In one or more embodiments, segments may only be added to the cache with their starting state. Alternatively, a more complex caching mechanism may be utilized wherein, when adding a segment to the cache, not only is the starting segment added to cache, but intermediate states of the segment may also be added. Such embodiments could reduce the number of cache misses further. In the example described herein, the third cache entry would be rendered obsolete. This cache mechanism would be complex since the number of intermediate states is infinite.

Piecewise Waveform

The Piecewise Waveform (PW) is a special data structure that was developed for this simulator. On the top level, this data structure consists of an ordered list of segments and their starting time. The segments themselves consist of an ordered list of (time, vector_value) pairs. The time step can vary within the segment. In embodiments of the invention, the first time in a segment is always zero and the last time step is always infinity, because the simulation is performed until steady state.

The value of the PW at a certain time T is equal to the value of the segment with the largest starting time that is not larger then T. The value of such a segment is equal to the interpolated value of the waveform represented by the points of the segment at time T minus the starting time of the segment.

Miscellaneous

As described above, an oscillation steady state may be utilized and can easily be detected if the same state is visited twice in the same transient (the pattern between these two events will be repeated indefinitely).

The number of simulations may also be decreased if the intermediate states point to the same waveform and if the future of a situation as well as the situation's past is simulated. The waveform generated in this way could be reused more often. Further, only two analog simulations may be needed for the oscillator example instead of three. The disadvantage would be more slightly complex stitching and a possible increase in the size of the cache.

Logical Flow

Figure 8:
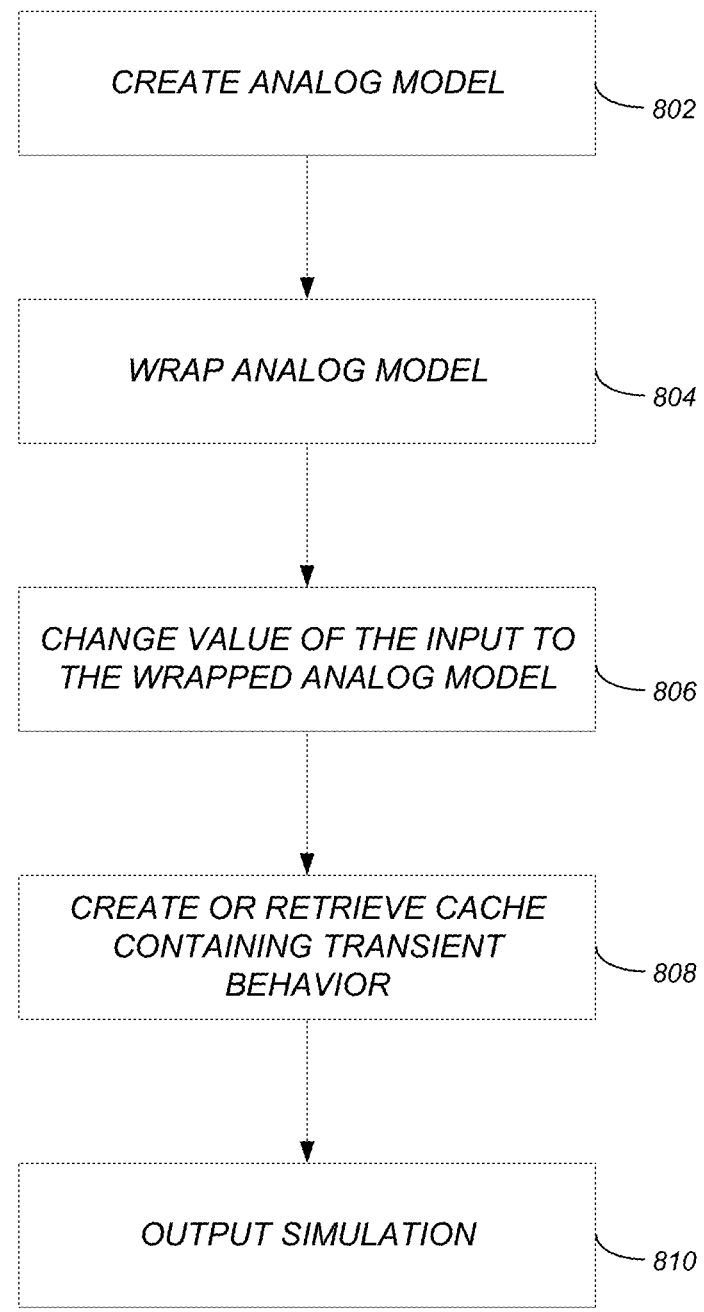
FIG. 8 is a flow chart illustrating the logical flow for simulating an electronic circuit in accordance with one or more embodiments of the invention.

FIG. 8 is a flow chart illustrating the logical flow for simulating an electronic circuit in accordance with one or more embodiments of the invention.

At step 802, an analog model that represents an analog circuit is created.

At step 804, the analog model is wrapped to serve as a first module in an event based simulator. The first module has a first start state (e.g., a state vector including capacitor voltages and inductor currents) and an input. The event based simulator controls the input and upon a change in a value of the input, the analog model shows a transient behavior (that is only dependent on the first start state and the value of the input). In addition, an output event may be triggered in the analog model. Such a triggering may be caused by an occurrence of a state event relative to the first start state. Thereafter, the analog model may output the output event that serves as input to an event based module of the event based simulator.

At step 806, the value of the input is changed (via the event based simulator) to begin simulating the analog circuit.

At step 808, in response to the changing of the value, a cache is checked. If already cached, the transient behavior is retrieved from the cache. If not already cached, the transient behavior is cached in the cache. The key for the cache is a combination of the first start state (also referred to as the "current state") and the value of the input. The cache may consist of a hashmap of K-Dimensional (KD) trees. In such embodiments, the hashmap may take the input in the form of an input vector as its key, and the KD-tree takes the first start state as its key.

To create the transient behavior, a waveform is simulated for the first start state until a steady state is reached. Thereafter, the transient behavior is the waveform. The waveform may be stitched to other already obtained waveforms to build a piecewise waveform that represents signal values for a complete simulation run. Such a stitching may include making the waveform absolute by adding a start time of the waveform, and adding the waveform to an event queue of the already obtained waveforms.

In one or more embodiments, the piecewise waveform is a data structure consisting of an ordered list of waveform segments and the start time of each waveform segment. A piecewise waveform value of the piecewise waveform at a certain time T is equal to a waveform segment value of the waveform segment with a largest starting time that is not larger than T. Further, the waveform segment value consists of an interpolated value of the waveform segment represented by points of the waveform segment at time T minus the starting time of the segment.

In alternative embodiments, the cache may be created and stored on a client computer or a server computer. If on a server computer, the electronic circuit can be simulated on a thin client device that accesses the cache on the server computer.

At step 810, a simulation of the circuit is output (e.g., displayed, transmitted/forwarded to a client/server, printed, etc.) based on the cached transient behavior.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

In view of the above, embodiments of the invention store the complete behavior (e.g., a wave form) of a circuit (from a certain state and a certain input to infinity) in a cache. Further, partial wave forms may be stitched together to create the full complete wave form that represents the behavior of the circuit. The cache is then utilized whenever a similar state and inputs are encountered (rather than repeating the computations based on such a state and inputs). With respect to analog based circuits, analog models may be embedded within an event based model that is discretized (where certain events occur at certain points in time). Based on a certain set of input, an event based model can calculate when the next event will occur and can push an event into an event queue. Accordingly, for analog electronics that are not discreet but are continuous in time, the analog circuit may be simulated, a cache is constructed, and the event based model can be built from the analog circuit on the fly.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for simulating an electronic circuit, comprising:
  (a) creating an analog model that represents an analog circuit;
  (b) wrapping the analog model to serve as a first module in an event based simulator, wherein:
    (1) the first module has a first start state and an input;
    (2) the event based simulator controls the input;
    (3) upon a change in a value of the input, the analog model shows a transient behavior, wherein the transient behavior comprises a way the electronic circuit responds to energies stored in storage elements of the electronic circuit over time, and wherein the transient behavior comprises a waveform from a simulation that achieves a steady state;
  (c) changing, via the event based simulator, the value of the input to begin simulating the electronic circuit;
  (d) in response to the changing of the value:
    (1) if not already cached:
      caching the transient behavior in a cache, wherein a key for the cache comprises a combination of the first start state and the value of the input; and
      simulating the waveform for the first start state until the steady state is reached, wherein the transient behavior comprises the waveform; and
      stitching the waveform to other waveforms to build a piecewise waveform that represents signal values for a complete simulation run, wherein the stitching comprises:
        making the waveform absolute by adding a start time of the waveform; and
        adding the waveform to an event queue of the other waveforms;
    (2) if already cached, retrieving the transient behavior from the cache; and
  (e) outputting a simulation of the circuit based on the cached transient behavior.

2. The computer-implemented method of claim 1, wherein the first start state comprises a state vector comprising capacitor voltages and inductor currents.

3. The computer-implemented method of claim 1, wherein the transient behavior is only dependent on the first start state and the value of the input.

4. The computer-implemented method of claim 1, wherein:
  the piecewise waveform comprises a data structure;
  the data structure comprises an ordered list of waveform segments and the start time of each waveform segment;
  a piecewise waveform value of the piecewise waveform at a certain time T is equal to a waveform segment value of the waveform segment with a largest starting time that is not larger than T; and
  the waveform segment value comprises an interpolated value of the waveform segment represented by points of the waveform segment at time T minus a starting time of the waveform segment.

5. The computer-implemented method of claim 1, further comprising:
   triggering an output event in the analog model, wherein the triggering is caused by an occurrence of a state event relative to the first start state; and
   the analog model outputting the output event that serves as input to an event based module of the event based simulator.

6. The computer-implemented method of claim 1, wherein:
   the cache is created and stored on a server computer; and
   the electronic circuit is simulated on a thin client device that accesses the cache on the server computer.

7. The computer-implemented method of claim 1, wherein:
   the cache comprises a hashmap of K-Dimensional (KD) trees;
   the hashmap takes the input in a form of an input vector as its key; and
   the KD-tree takes the first start state as its key.

8. An electronic circuit simulator comprising:
   (a) a computer system having a memory;
   (b) an analog model, in the computer system, that represents an analog circuit;
   (c) an event based simulator in the computer system;
   (d) a first module, in the event based simulator, comprising a wrapped version of the analog module, wherein:
      (1) the first module has a first start state and an input;
      (2) the event based simulator controls the input;
      (3) upon a change in a value of the input, the analog model shows a transient behavior, wherein the transient behavior comprises a way the analog circuit responds to energies stored in storage elements of the analog circuit over time, and wherein the transient behavior comprises a waveform from a simulation that achieves a steady state;
      (4) the event based simulator changes the value of the input to begin simulating the analog circuit;
   (e) a cache, wherein in response to the changing of the value:
      (1) if not already cached:
         the transient behavior is cached in the cache, wherein a key for the cache comprises a combination of the first start state and the value of the input;
         the waveform is simulated for the first start state until the steady state is reached, wherein the transient behavior comprises the waveform;
         the waveform is stitched to other waveforms to build a piecewise waveform that represents signal values for a complete simulation run, wherein the waveform is stitched by:
            making the waveform absolute by adding a start time of the waveform; and
            adding the waveform to an event queue of the other waveforms; and
      (2) if already cached, the transient behavior is retrieved from the cache; and
   (f) a simulation of the electronic circuit that is output based on the cached transient behavior.

9. The electronic circuit simulator of claim 8, wherein the first start state comprises a state vector comprising capacitor voltages and inductor currents.

10. The electronic circuit simulator of claim 8, wherein the transient behavior is only dependent on the first start state and the value of the input.

11. The electronic circuit simulator of claim 8, wherein:
   the piecewise waveform comprises a data structure;
   the data structure comprises an ordered list of waveform segments and the start time of each waveform segment;
   a piecewise waveform value of the piecewise waveform at a certain time T is equal to a waveform segment value of the waveform segment with a largest starting time that is not larger than T; and
   the waveform segment value comprises an interpolated value of the waveform segment represented by points of the waveform segment at time T minus a starting time of the waveform segment.

12. The electronic circuit simulator of claim 8, wherein:
   the first module triggers an output event in the analog model, wherein the triggering is caused by an occurrence of a state event relative to the first start state; and
   the analog model outputs the output event that serves as input to an event based module of the event based simulator.

13. The electronic circuit simulator of claim 8, wherein:
   the cache is created and stored on a server computer; and
   the electronic circuit is simulated on a thin client device that accesses the cache on the server computer.

14. The electronic circuit simulator of claim 8, wherein:
   the cache comprises a hashmap of K-Dimensional (KD) trees;
   the hashmap takes the input in a form of an input vector as its key; and
   the KD-tree takes the first start state as its key.

* * * * *